United States Patent [19]

Kennon et al.

[11] Patent Number: 5,488,565
[45] Date of Patent: Jan. 30, 1996

[54] TAMPER DETECTION METHODS AND APPARATUS FOR LOAD MANAGEMENT TERMINALS

[75] Inventors: Jerry M. Kennon; Michael A. Murphy; Kenneth C. Shuey, all of Raleigh, N.C.

[73] Assignee: ABB Power T&D Company Inc., Raleigh, N.C.

[21] Appl. No.: 68,768

[22] Filed: May 28, 1993

[51] Int. Cl.$^6$ .......................... G01R 11/24; G08B 21/00
[52] U.S. Cl. ..................... 364/483; 364/492; 307/38; 307/132 EA; 324/110; 340/635; 340/870.02; 340/870.16; 340/309.15
[58] Field of Search ........................ 364/483, 492; 324/110; 340/637, 650, 568, 870.02, 870.03, 870.09, 870.16, 309.15, 310 A, 310 R, 635; 307/132, 132 E, 132 EA, 132 T, 132 M, 30, 31, 32, 38, 39, 41; 361/160, 161, 162, 163, 165, 170, 187, 188

[56] References Cited

U.S. PATENT DOCUMENTS

| | | | |
|---|---|---|---|
| 4,190,800 | 2/1980 | Kelly, Jr. et al. | 340/310 A |
| 4,301,444 | 11/1981 | Bruckert et al. | 340/870.02 |
| 4,331,915 | 5/1982 | Fielden | 324/110 |
| 4,357,601 | 11/1982 | McWilliams | 340/870.02 |
| 4,424,030 | 1/1984 | Bateman et al. | 324/110 |
| 4,532,471 | 7/1985 | Hurley | 324/110 |
| 4,540,984 | 9/1985 | Waldman | 307/132 E |
| 4,571,691 | 2/1986 | Kennon | 364/483 |
| 4,656,593 | 4/1987 | Gleba et al. | 364/492 |
| 4,680,706 | 7/1987 | Bray | 307/132 EA |
| 4,707,679 | 11/1987 | Kennon et al. | 340/310 |
| 4,850,010 | 7/1989 | Stanbury et al. | 379/107 |
| 4,977,515 | 12/1990 | Rudden et al. | 364/492 |
| 4,980,836 | 12/1990 | Carter et al. | 307/31 |
| 5,086,292 | 2/1992 | Johnson et al. | 324/110 |
| 5,345,225 | 9/1994 | Davis | 307/38 |

FOREIGN PATENT DOCUMENTS

| | | | |
|---|---|---|---|
| 0085769 | 8/1983 | European Pat. Off. | 324/110 |
| 2225867 | 6/1990 | United Kingdom | 324/110 |
| 2260415 | 4/1993 | United Kingdom | 324/110 |

*Primary Examiner*—Emanuel T. Voeltz
*Assistant Examiner*—Eric W. Stamber
*Attorney, Agent, or Firm*—Woodcock Washburn Kurtz Mackiewicz & Norris

[57] ABSTRACT

Apparatus and methods are claimed for detecting tampering with a load management terminal, wherein the terminal has a load control relay coupled to a power line for selectably decoupling the load from the power line. One embodiment of the claimed apparatus for detecting tampering comprises a current sensor coupled to the load control relay for sensing whether load current is flowing through the load control relay contacts when the contacts are closed. A timer is provided for measuring elapsed time during which no current is sensed flowing through the closed contacts. An indicator provides an indication of tampering when the elapsed time measured by the timer exceeds a pre-determined time limit. Preferably, in this embodiment, the current sensor comprises a voltage detector coupled to the control coil of the relay for detecting whether an AC voltage has been induced in the control coil by the load current. In another embodiment, a voltage sensor is provided for sensing whether voltage is present across the contacts of the relay when the contacts are open. In yet another embodiment, a suitable resistance is connected to the power line in parallel with the load thermostat to ensure at least a nominal current flow through the load control relay at all times. Tampering is indicated when an interruption in the continuous current flow is detected.

14 Claims, 10 Drawing Sheets

TAMPER DETECTION METHODS AND APPARATUS FOR LOAD MANAGEMENT TERMINALS

FIELD OF THE INVENTION

The present invention relates generally to electric power load management and, more particularly, to methods and apparatus for detecting tampering with remotely installed load management terminals.

BACKGROUND OF THE INVENTION

A serious problem confronting electrical utility companies today is the inability to handle the excessive demand placed on an electrical power distribution system during peak demand hours. Periods of excessive demand occur, for example, during very hot summer days when simultaneous usage of air conditioning units is widespread. The extreme demand placed on a power distribution system during such peak demand periods can lead to service interruptions, such as "brown-outs." In an effort to prevent or minimize service interruptions during peak demand periods, utility companies are beginning to employ remotely controllable load management terminals at selected customer locations.

A typical load management terminal has a relay connected to the power line in series with the load. The types of loads most often targeted in a load management system are large appliances such as water heaters and air conditioning units. During peak demand periods, a utility can transmit a command to a load management terminal causing that terminal to open the relay and prevent current from flowing to the load, thereby "shedding" the load from the power line. Some load management terminals are adapted to receive commands directly over the power line, for example, on a high frequency carrier. Other load management terminals employ radio receivers for receiving remote commands.

Participation by a consumer in a utility's load management program is often voluntary; that is, the consumer agrees to let the utility install a load management terminal in return for some form of credit or rebate on the consumer's electric bill. Once a load management terminal has been installed for a particular load, the utility can begin to remotely shed that load at various times during a peak demand period. Utilities try to perform load shedding in such a way as to minimize the discomfort and inconvenience to the customer. However, some discomfort and inconvenience is inevitable.

Unfortunately, some customers will accept a load management terminal in order to obtain financial benefit from the utility and then will tamper with the load management terminal in an attempt to disable it. Consequently, utilities have realized the need to detect such tampering efforts easily without significantly adding to the cost of the terminal. As can be expected, there are many ways to tamper with a load management terminal, and therefore, tamper detection methods and apparatus depend on the particular form of tampering that the utility is trying to detect.

Virtually all load management terminals have some form of outer housing that surrounds the load management relay and other internal components. Tampering by adjusting or circumventing the internal components, therefore, will require opening the terminal housing. Consequently, most load management terminals provide some sort of tamper indication when the outer housing has been opened or breached in some manner. For example, Rudden et. al., U.S. Pat. No. 4,977,515, describes the use of a sensor to detect opening of the housing. Stanbury et. al., U.S. Pat. No. 4,850,010, also describes detecting the opening of a terminal's housing. Additionally, many current load management terminals are microprocessor based and contain some amount of electronic memory. Subjecting such a load management terminal to a severe magnetic field can disrupt the electronic memory circuits and otherwise interfere with the ability of the load management terminal to shed its load. Aforementioned U.S. Pat. No. 4,997,515 discloses a means for detecting this form of tampering. Essentially, a Gauss detector is used to measure magnetic fields present in the terminal and to signal a microprocessor whenever a magnetic field strong enough to disrupt the terminal is detected.

Another form of tampering with load management terminals involves the connection of a by-pass link to the power line in parallel with the load control relay of the load management terminal. Such by-pass links effectively take the load control relay out of the circuit because current is shunted around the relay. Thus, when the normally closed contacts of the load control relay are opened in response to a load shed command, current will still be supplied to the load through the by-pass link. This last form of tampering is not adequately addressed in the prior art of load management. In the somewhat related area of electrical energy consumption meters, however, the problem of meter tampering using a by-pass link around the meter has been addressed. However, the solutions have been complex and expensive, and therefore, unsatisfactory for use in load management terminals.

For example, Fielden, U.S. Pat. No. 4,331,915, describes one method for detecting the presence of a by-pass link across the live connection through an electrical watt-hour meter. According to the method of Fielden, a voltage transformer in the meter is used to induce a small voltage in the live connection in opposition to the normal supply voltage. In the absence of tampering, the induced voltage has a negligible effect. When a by-pass link is connected, however, the induced voltage produces a circulating current in the loop formed by the live connection and the by-pass link. This induced current will be in phase opposition to the normal supply voltage. A phase comparator is used to compare the phase of the induced current with the phase of the supply voltage. A detected phase opposition indicates tampering. While this solution may be satisfactory for electrical watt-hour meters, it is not satisfactory for use in load management terminals. Fielden's method requires too much additional hardware, and therefore, is relatively expensive. Cost is more of a concern with load management terminals than with electrical watt-hour meters because, in addition to the cost of the terminal, utilities must also provide a credit to consumers who agree to have such terminals installed. Accordingly, the tamper detection method of Fielden does not provide a satisfactory solution for load management terminals.

Hurley, U.S. Pat. No. 4,532,471, describes another tamper detection method for electrical meters. Again, however, this solution is unsatisfactory for use with load management terminals due to its complexity and resulting cost. Hurley employs a current transformer and associated electronics to sense a change in impedance that results from the connection of a by-pass link around the meter. The current transformer is coupled to the power line conductor within the meter such that the power line forms a primary winding for the transformer and defines a primary circuit. The multi-turn secondary winding on the current transformer defines a secondary circuit. A by-pass link connected across the meter will cause a change in the impedance reflected from the primary circuit into the secondary circuit. A measuring device is connected to the current transformer for detecting such changes. Although this method achieves tamper detection, it too is not cost efficient for use in load management terminals due to its complexity.

A need arises, therefore, for methods and apparatus for detecting tampering with load management terminals that does not significantly add to the cost of manufacturing such terminals. In particular, cost efficient methods and apparatus are needed for detecting the connection of a by-pass link to the power line in parallel with the load control relay of the load management terminal in an effort to "short-circuit" around the relay. The present invention satisfies these needs.

SUMMARY OF THE INVENTION

Briefly stated, the present invention comprises methods and apparatus for detecting tampering with a load management terminal. Load management terminals have a load control relay connected to the power line for selectably decoupling the load from the power line by opening the relay.

According to one embodiment of the present invention, apparatus for detecting tampering with a load management terminal comprises a current sensor for sensing whether load current is flowing through the load control relay contacts when the contacts are closed. A timer measures the elapsed time during which no load current is sensed flowing through the closed contacts of the load control relay. An indicator is provided for indicating tampering when the elapsed time measured by the timer exceeds a pre-determined time limit. The timer and indicator may comprise a microprocessor coupled to the sensor. The indicator may further comprise a light emitting diode coupled to the microprocessor. The tamper detection apparatus is preferably positioned within the housing of the load management terminal.

Preferably, the tamper detection apparatus further comprises a non-volatile memory for storing the elapsed time measured by the timer and for storing any tamper indication in the event of a power failure. Storage of these parameters in a non-volatile memory enables tamper detection to resume after power is restored. The tamper detection apparatus may further comprise means for resetting the timer if load current is sensed before the measured elapsed time exceeds the pre-determined limit.

In a most preferred embodiment, the current sensor comprises a voltage detector coupled to the control coil of the load control relay for detecting an AC voltage in the control coil. Load current flowing through the closed contacts of a load control relay will induce an AC voltage in the unenergized control coil of the relay. The control coil operates as a current-to-voltage transducer. Detecting an AC voltage in the control coil indicates that load current is flowing through the relay. Preferably, the voltage detector comprises an AC millivolt-level zero crossing comparator.

Alternatively, the current sensor may comprise a current transformer coupled to the power line proximate the load control relay for producing an output voltage proportional to the current flowing through the power line, and hence, through the relay. A comparator may be coupled to the current transformer for comparing the output voltage to a pre-determined threshold voltage and for providing an indication of the presence of load current when the output voltage is greater than the threshold voltage.

In operation, the apparatus performs the following steps: (a) sensing whether load current is flowing through the contacts of the load control relay; (b) maintaining a measure of elapsed time during which no load current is sensed flowing through the contacts of the load control relay; and (c) generating a tamper indication when the elapsed time exceeds a pre-determined time limit. As mentioned, load current is preferably sensed by measuring the voltage, if any, induced in the control coil of the load control relay by that load current. In a microprocessor based embodiment, data loss in the event of a power failure is avoided by storing the measured elapsed time in the non-volatile memory prior to complete power failure. Any tamper indication is also stored in the non-volatile memory at this time. If load current is sensed flowing through the closed contacts before the measured elapsed time exceeds the pre-determined limit, then the timer is reset.

According to a second embodiment, the tamper detection apparatus of the present invention comprises a voltage sensor coupled to the load control relay for sensing whether voltage is present across the relay contacts when the relay contacts are open. A timer is provided for measuring elapsed time during which no voltage is sensed across the open relay contacts. An indicator provides an indication of tampering when the elapsed time measured by the timer exceeds a predetermined time limit. Preferably, the sensor, timer and indicator are positioned within the load management terminal housing.

The timer and indicator may comprise a microprocessor coupled to the sensor. The indicator may further comprise a light emitting diode coupled to the microprocessor. Preferably, the microprocessor is optically isolated from the sensor. A non-volatile memory may further be provided for storing the elapsed time measured by the timer and for storing the tamper indication provided by the indicator in the event of a power failure. As explained above, storage of these parameters in the non-volatile memory enables tamper detection to resume after power is restored.

According to the second embodiment, the tamper detection apparatus may further comprise means for holding the relay open until a voltage is sensed across the relay. Additionally, means may be provided for resetting the timer if a voltage is sensed before the predetermined limit expires.

In operation, tamper detection is performed by: (a) opening the relay; (b) sensing whether voltage is present across the open relay contacts; (c) maintaining a measure of elapsed time during which no voltage is sensed across the open relay contacts; and (d) generating a tamper indication when the measured elapsed time exceeds a pre-determined time limit. If voltage is sensed before the time limit expires, then the timer is reset. Again, to avoid data loss due to a power failure, the elapsed time measured by the timer is stored in the non-volatile memory just prior to complete power failure. Any tamper indication is also stored in the non-volatile memory.

As mentioned in the Background, most residential and commercial loads, such as water heaters and air conditioners, have a mechanical thermostat that controls the load. Consequently, current through the load is periodically interrupted by the thermostat. According to a third embodiment, the tamper detection apparatus of the present invention comprises a resistance; connected in parallel with at least the load thermostat, and a current sensor for sensing current flow through the load control relay and for detecting interruptions in the current flow. In some implementations, the resistance may be connected to the power line so as to be in parallel with the series combination of the load and thermostat. In either case, the resistance operates to ensure at least a nominal current flow through the load control relay even when the load thermostat contacts are open. Thus, current flows through the load control relay continuously. An indicator is provided for indicating tampering when an interruption in the continuous current flow through the relay is detected by the sensor. When a utility customer has an electronic thermostat, a constant current sink is already provided in the load management terminal to ensure the nominal current flow. In such cases, no additional resistance is needed.

Additional features and advantages of the present invention will become evident hereinafter.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings, embodiments that are preferred, it being understood, however, that the invention is not limited to the specific methods and instrumentalities disclosed. In the drawings.

DETAILED DESCRIPTION OF THE PREFERRED EMBODIMENTS

Figure 1:
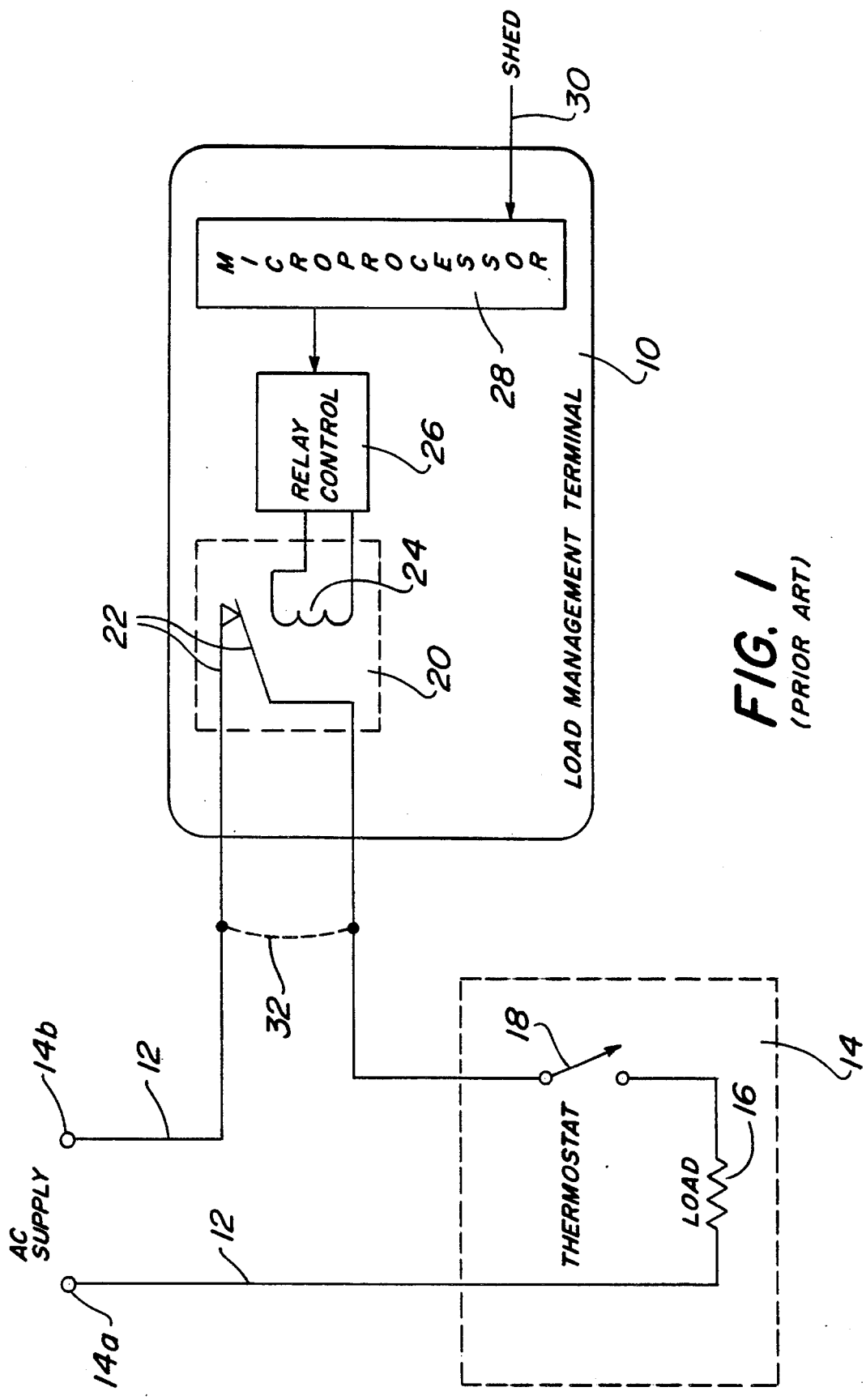
FIG. 1 is a block diagram illustrating an exemplary application of a prior art load management terminal.

Referring to the drawings wherein like numerals indicate like elements throughout, there is shown in FIG. 1 an exemplary application of a prior art load management terminal 10. As shown, the terminal 10 is coupled to a power line 12 for controlling the supply of power to a load 16. Power is normally supplied to the load across terminals 14a and 14b. The load 16 may comprise any type of power line load, such as a residential water heater or an air conditioning unit, and may include a thermostat 18 connected in series with the load.

The load management terminal 10 comprises a load control relay 20 coupled to the power line 12 so as to be in series with the load 16. Typically, the relay 20 is of the normally-closed type. Relay control circuitry 26 is coupled to the control coil 24 of the relay 20 for opening and closing the contacts 22 of the relay 20 in response to a signal from a microprocessor 28. Microprocessor 28 controls the overall operation of the terminal 10. As mentioned, the load control relay's contacts 22 are normally closed. When the load 16 demands power (i.e., the load's thermostat 18 closes) current will flow through the relay's contacts 22 to the load 16. Load shedding is achieved by opening the contacts 22 and interrupting the flow of current to the load 16.

In operation, the load management terminal may receive a "shed" command from the utility company during periods of peak demand. As indicated previously, many techniques are known for communicating with a load management terminal to provide the terminal with a "shed" command. For example, several techniques exist for communicating with a load management terminal via the power line itself. Other techniques involve the use of an R-F receiver in the terminal 10 for receiving signals transmitted from a central station. In the example shown, shed commands are received using any well known method and provided, via line 30, to the microprocessor 28. In response to a "shed" command, the microprocessor 28 will provide a signal to the relay control circuitry 26 which, in turn, will energize the control coil 24 of the relay 20 thereby causing the contacts 22 to open. Thus, the load 16 is effectively decoupled (i.e., "shed"!) from the power line. The duration of the load shed interval is also determined by the utility.

As explained in the Background of the Invention, utility companies often provide a financial incentive to customers who are willing to have a load management terminal installed. Unfortunately, unscrupulous customers may try to disable the load management terminal to prevent load shedding while retaining the financial incentive provided by the utility company. As shown in FIG. 1, and as described in the Background, one form of tampering not adequately addressed in the prior art involves the connection of a by-pass link 32 to the power line 12 in parallel with the contacts 22 of the load control relay 20. By-pass link 32 effectively removes the load control relay 20 from the power line circuit because load current is shunted around the relay contacts 22. Thus, when the normally closed contacts 22 are opened in response to a load shed command, current will still be supplied to the load 16 through the by-pass link 32. Detection of this form of tampering is of paramount importance to utility companies. As explained in the Background, cost efficient methods and apparatus are needed for detecting the connection of such by-pass links. The present invention satisfies these needs. Preferred embodiments of the present invention are described hereinafter.

First Embodiment

Figure 2:
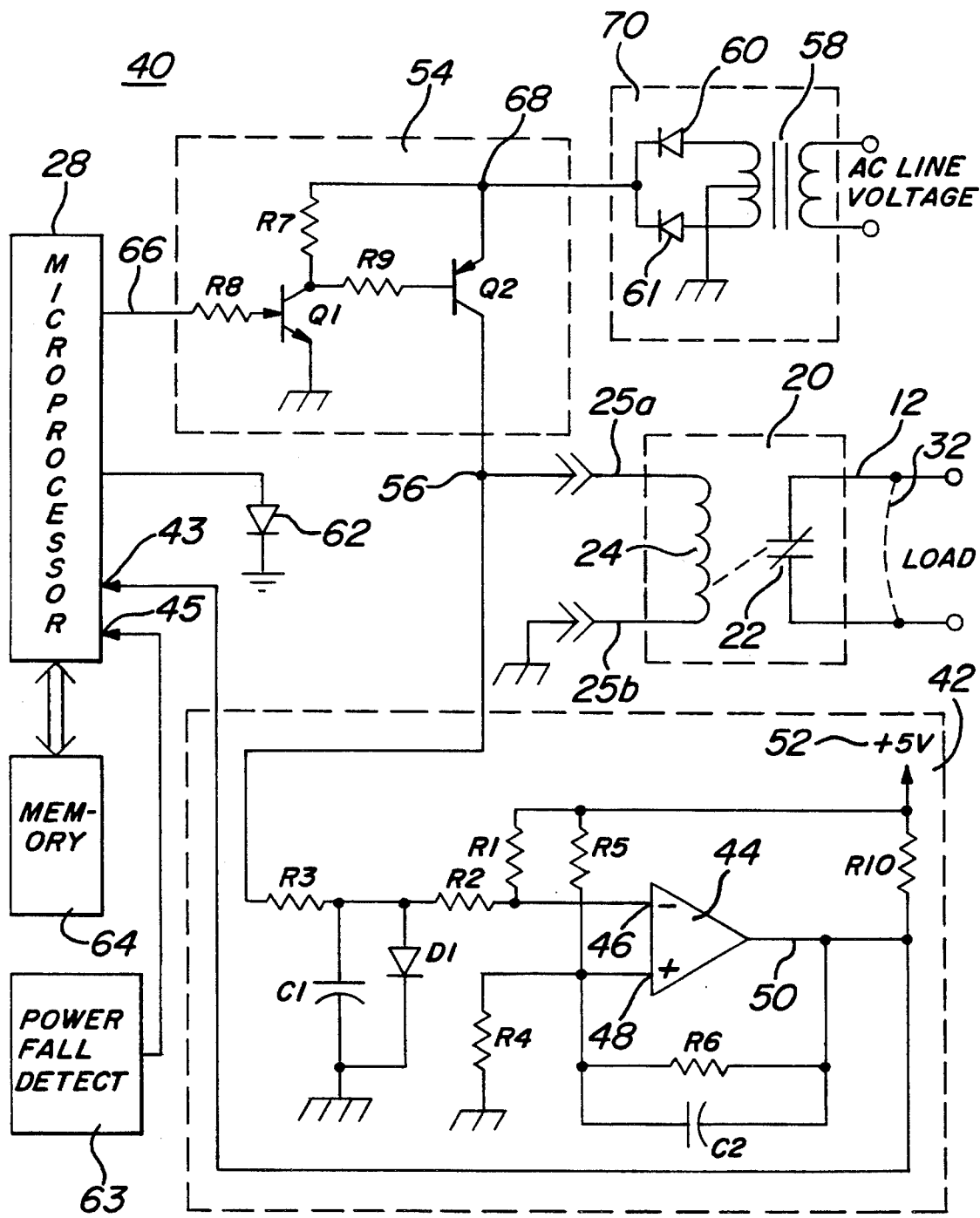
FIG. 2 shows an apparatus for detecting tampering with a load management terminal in accordance with a first embodiment of the present invention.

FIG. 2 shows apparatus 40 for detecting tampering with a load management terminal (LMT) in accordance with a first, most preferred embodiment of the present invention. For purposes of illustration, FIG. 2 shows a load control relay 20 (e.g. relay 20 of FIG. 1) coupled to a power line 12. Preferably, the apparatus 40 shown in FIG. 2 is positioned within the, housing of the LMT to prevent unauthorized access. According to the first embodiment, tampering (i.e., a by-pass link 32 connected in parallel with the load control relay 20) is detected by sensing whether current is flowing through the normally closed contacts 22 of the load control relay 20. As explained above, if a by-pass-link 32 is present, little or no current will flow through the closed contacts 22. Applicants recognize, however, that an absence of current may be the result of an open thermostat, and not the result of a by-pass link. Accordingly, tamper is only indicated if current does not appear within a predetermined time limit. To give the customer the benefit of any doubt, the predetermined time limit may be relatively long, such as thirty days. If no load current is sensed during that period, however, then tampering is probable.

According to the present embodiment, the tamper detection apparatus 40 comprises a current sensor for sensing load current flowing through the closed contacts 22 of the load control relay 20. Preferably, the current sensor comprises a voltage detector 42 coupled to the control coil 24 of the load control relay for detecting an AC voltage in the coil 24. Load current flowing through the normally closed contacts 22 of the relay 20 will induce a small AC voltage in the control coil 24. In this regard, the control coil 24 operates as a current-to-voltage transducer with the relay contacts 22 defining a single turn primary and the coil 24 defining the secondary. Detection of an AC voltage in the control coil 24 indicates that load current is flowing through the closed contacts 22 of the relay 20 and that, therefore, no by-pass link is present. As shown, the output of the sensor (i.e., the output of the voltage detector) is coupled to a microprocessor 28.

Figure 2A:
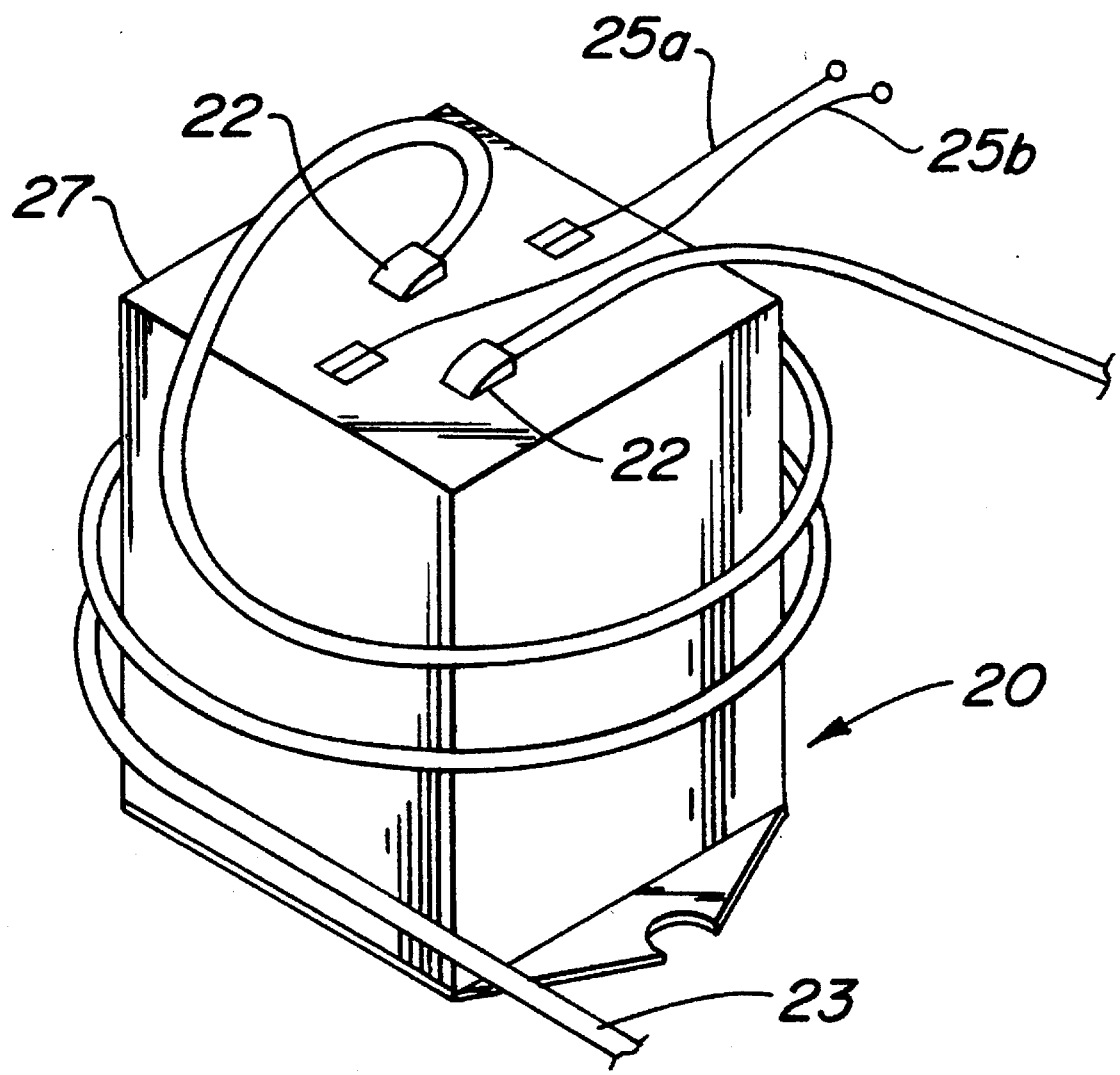
FIG. 2A shows a load control relay having a portion of one of the relay's contact leads wrapped around the outer housing of the relay in accordance with an aspect of the present invention.

Because the induced voltage in the control coil 24 will be small, e.g. 10–20 millivolts, it may be desirable to increase the induced voltage. According to a further aspect of the present invention, one or both of the relay contact leads, or a portion of the power line connected to the contact leads, may be wrapped around the outside of the relay 20 in a manner that increases the induced AC voltage in the coil. FIG. 2A shows a load control relay 20 in which a portion of a contact lead 23 is wrapped around the outer housing 27 of the relay 20 in accordance with this aspect of the present invention.

Referring again to FIG. 2, in the present embodiment, the voltage detector 42 comprises an AC milli-volt level zero crossing detector that employs an operational amplifier 44. Operational amplifier 44 functions as a comparator. The bias voltage applied to the non-inverting input 48 of the amplifier 44 is determined by resistors R4, R5, and R6. The voltage at the inverting input 46 is determined by resistors R1, R2, R3 and the nominal resistance of the relay control coil 24. The switching threshold of the amplifier 44 is determined by the relative biasing at the inputs 46, 48. Because the voltage, if any, induced in the relay coil 24 by current flowing through the contacts 22 may be on the order of 10–20 millivolts, it is desirable to provide equal biasing at each input. Consequently, resistors R1 and R5 are preferably of equal value, and the value of resistor R4 in parallel with resistor R6 is equal to the combined values of resistors R2 and R3 and the nominal resistance of the control coil 24. With equal biasing, the switching threshold is well below the 10–20 millivolt level. According to one embodiment, the resistors and capacitors have the following values: R1=100 kΩ; R2=4.9 kΩ; R3=4.9 kΩ; R4=10 kΩ; R5=100 kΩ; R6=10 Ω; C1=0.01 μF and C2=10 pF.

In operation, the output of fire amplifier 44 will switch between logic-high and logic-low for each cycle of AC voltage in the coil 24 that exceeds the switching threshold. When current is continuously flowing through the contacts 22, therefore, a continuous pulse train will appear at the output 50 of the amplifier 44. When current is not flowing through the contacts 22, the output 50 of the amplifier 44 will remain at logic-high. Microprocessor 28, therefore, is able to sense current flowing through the closed contacts 22 of the relay 20 by detecting the low-high/high-low transitions at input 43. A 5 V pull-up voltage is applied to the input 43 through resistor R10.

Feedback is provided from the output 50 of the amplifier 44 to the non-inverting input 48 using resistor R6 and capacitor C2. The feedback operates to "square-up" the output of the amplifier 44. Capacitor C1, in combination with resistor R3, operates to filter unwanted frequencies from the AC voltage induced in the control coil 24. Diode D1 is operative during a normal load shed to prevent damage to the amplifier 44. As explained below in greater detail, during a normal load shed, an energizing voltage (≈12 V) is applied to the positive terminal of the relay coil 24. As can be seen, this voltage will also enter the voltage detector 42. Diode D1 operates to clip the energizing voltage to prevent the voltage from damaging the amplifier 44. Clipping does not occur, however, for voltages below about 0.6 volts, and therefore, diode D1 has no effect during a current sensing operation.

Using the control coil 24 as a current-to-voltage transducer obviates the need for a separate current transformer and therefore reduces the cost of the tamper detection apparatus 40. However, it is understood that a separate current transformer could be employed without deviating from the spirit and scope of the present invention. As used in the claims, the term "current sensor" is employed to cover all such possibilities. For example, the current sensor may comprise a current transformer (not shown) coupled to the power line 12 proximate the load control relay 20 for producing an output voltage having a magnitude proportional to the current flowing through the power line 12, and a comparator (not shown) coupled to the current transformer for comparing the output voltage from the transformer to a pre-determined threshold voltage. Current is present when the output voltage from the transformer exceeds the threshold value.

The tamper detection apparatus 40 further comprises a timer for measuring elapsed time during which no load current is sensed flowing through the closed contacts 22 of the relay 20, and an indicator for indicating tampering when the elapsed time measured by the timer exceeds a predetermined time limit. In the present embodiment, microprocessor 28 is employed to implement the timer, but a discrete component may be employed. For example, a 555 IC timer (not shown) can be used in connection with a counter (not shown). Microprocessor 28, in combination with an LED 62, is also employed in the present embodiment to implement the tamper indicator. Preferably, tamper is indicated by continuously flashing the LED 62 at ¼ second intervals. Implementing the timer and tamper indicator in the microprocessor 28 is extremely cost efficient. In the present embodiment, microprocessor 28 is a Motorola 68HC11 family microprocessor, however, any suitable microprocessor may be employed.

Most load management terminals draw power directly from the power line, and therefore, are susceptible to power outages. Moreover, a devious customer may attempt to interrupt a tamper detection cycle by momentarily disconnecting the terminal from the power line. According to the present embodiment, a power fail detector 63 is provided for detecting interruptions in the power provided to the microprocessor 28. Any circuitry for detecting power failure may be employed, and further details of the power fail detector 63 are neither necessary nor limiting. When a power failure is detected, the power fail detector 63 provides a signal to an input 45 of microprocessor 28. A non-volatile memory 64 is coupled to the microprocessor 28 for storing the elapsed time measured by the timer and for storing any tamper indication in the event of a power failure. Consequently, customers cannot defeat tamper detection by momentarily disconnecting power to the LMT. Preferably, the memory 64 comprises an electrically erasable programmable read only memory (EEPROM), however, any suitable non-volatile memory technology may be employed.

As described above, the contacts 22 of the relay 20 are normally closed. During normal operation of the LMT, load shedding is achieved by opening the contacts 22 of the relay 20. As shown in FIG. 2, relay control circuitry 54 is provided for energizing the relay coil 24 to open the relay contacts 22 in response to a signal output from the microprocessor 28 on line 66. The relay control circuitry 54 comprises resistors R7, R8 and R9 and a pair of transistors Q1, Q2 connected as shown. The circuitry 54 operates as a switch with a first terminal 68 connected to a power supply and a second terminal 56 connected to one side of the relay coil 24. The other side of the relay coil 24 is grounded. Power is supplied from the AC line voltage with a transformer 58. In the present embodiment, the transformer provides a 12 volt AC output. Diodes 60 and 61 perform full wave rectification to produce an unfiltered DC voltage signal. When a logic-high signal is provided via line 66, the control coil 24 will be energized with the unfiltered DC voltage from the power supply 70. As mentioned above, diode D1 in the voltage detector 42 operates to shunt the unfiltered DC voltage to ground during a load shed to prevent damaging the amplifier 44.

Figure 3A:
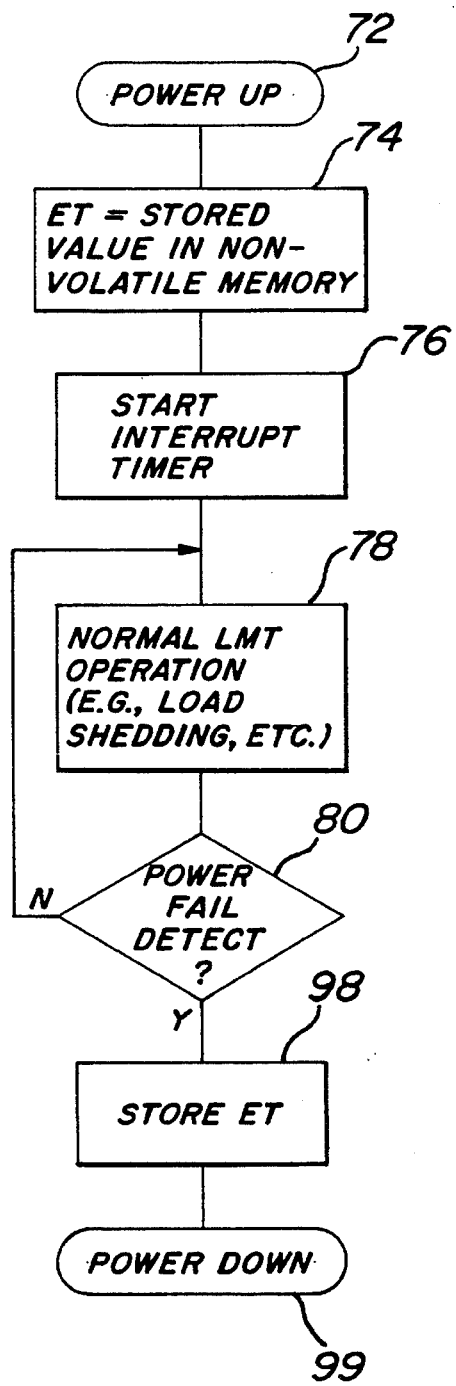
FIGS. 3A and 3B comprise a flowchart illustrating details of the operation of the apparatus of FIG. 2.
Figure 3B:
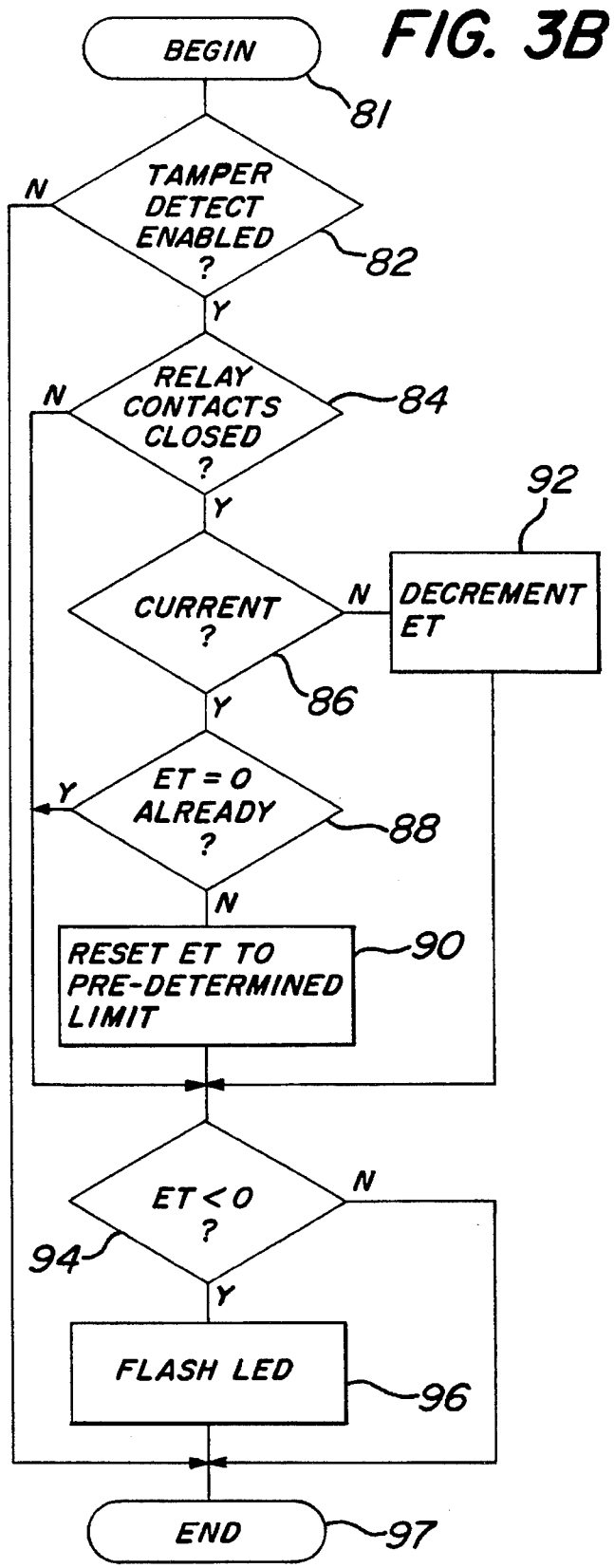

FIGS. 3A and 3B comprise a flow chart illustrating details of the operation of the apparatus 40 of FIG. 2, and the operation of the microprocessor 28 in particular. FIG. 3A illustrates a "main" processing loop of the microprocessor 28, and FIG. 3B illustrates an interrupt routine that is performed in response to a software interrupt generated by the microprocessor 28. Prior to installation of the apparatus 40 at a customer location, the pre-determined time limit, which determines when tamper should be indicated, is stored in a location of the non-volatile memory 74. Referring to FIG. 3A, upon power-up of the apparatus 40 (step 72), control passes immediately to step 74 where an elapsed time variable (ET) is set equal to the predetermined time limit stored in the non-volatile memory. According to the present embodiment, the measure of elapsed time is maintained by decrementing ET. When ET reaches zero (ET<=0), the pre-determined time limit has expired and tamper will be indicated. Loading ET with the pre-determined time limit and decrementing ET until it reaches zero is the equivalent of loading ET with zero and incrementing ET until it reaches the pre-determined time limit. However, decrementing ET and testing for zero is easier to implement in the microprocessor 28.

At step 76, a software interrupt timer (not shown) is initialized and activated. According to the present embodiment, the software interrupt timer generates a software interrupt every ½ second. Control then passes to a "main" loop comprising steps 78 and 80. During step 78, normal LMT operations are performed. For example, any communications between the LMT and the utility may be performed. Additionally, any load shed operations may be performed during this step. At step 80, the power fail detector 63 determines whether power to the apparatus 40 has been interrupted. If not, control passes back to step 78.

As long as power to the apparatus 40 is not interrupted, the microprocessor 28 continuously loops through steps 78 and 80.

Each time the microprocessor 28 receives a software interrupt, which in the present embodiment is every ½ second, the microprocessor "jumps" to the interrupt routine illustrated in FIG. 3B. Steps 82 through 96 of the interrupt routine are therefore executed once every ½ second. All tamper detection operations are performed in this interrupt routine. As can be appreciated, with the software interrupt facility of the microprocessor 28, tamper detection can effectively occur in tandem with the normal functioning of the LMT.

As shown in FIG. 3B, upon entering the interrupt routine (step 81), control passes immediately to step 82. At step 82, a tamper detect enable flag stored in the non-volatile memory 64 is examined. If the flag is set, then tamper detection is enabled and the apparatus 40 will perform tamper detection. If the flag is not set, then no tamper detection is performed and the microprocessor 28 simply exits the interrupt routine at step 97, passing control back to the "main" loop (steps 78–80). With the tamper detect flag, utilities can enable or disable tamper detection at any customer site.

If tamper detection is enabled, i.e., the tamper detect flag is set, then control passes from step 82 to step 84. At step 84, the microprocessor determines whether the relay contacts 22 are open or closed. Load current may only be sensed when the relay contacts are closed. If the contacts are closed, control passes to step 86 where the microprocessor 28 examines the signal at input 43 to determine whether current is being sensed. If no current is sensed, then ET is decremented at step 92 and control then passes to step 94. At step 94, the microprocessor 28 determines whether ET is less than or equal to zero. If ET is less than or equal to zero, then the tamper LED is flashed at step 96 and the microprocessor then exits the interrupt routine (step 97) and control passes back to the main loop. If ET is not less than or equal to zero, then the microprocessor 28 skips step 96 and simply exits the interrupt routine. Thus, the microprocessor 28, through the variable, ET, implements a timer for measuring the elapsed time during which no current is sensed flowing through the normally closed relay contacts 22. Tamper is indicated when the measure of elapsed time exceeds the predetermined limit (i.e., ET<=0). Because the absence of current may be the result of an open thermostat (i.e., the load is not demanding power), ET is preferably initialized with a large value equal to about thirty days.

If load current is sensed at step 86, then control passes to step 88 where the microprocessor 28 determines whether ET has already reached zero. If not, ET is reset to the predetermined time limit. Having been reset, ET will not equal zero at step 94, and the microprocessor 28 exits the interrupt routine. If, however, it is determined at step 88 that ET has already reached zero, then ET is not reset at step 90. Rather, control passes through step 94 to step 96 where the LED is flashed to indicate tamper. As can be appreciated, once ET reaches zero, it is never reset, and therefore, step 96 is performed each time the interrupt routine is executed. Consequently, the LED will continuously flash every ½ second. As explained above, each flash of the LED preferably has a duration of ¼ second.

When the relay contacts are open, such as during a load shed interval, no current will flow through the relay contacts 24 regardless of whether a customer is tampering with the apparatus 40. Accordingly, if the microprocessor 28 determines in step 84 that the relay contacts are open, then current sensing is not performed and control passes directly to step 94. Unless tamper has already been indicated, i.e., ET has already reached zero, the microprocessor will simply exit the interrupt routine at step 97 and control will pass back to the main loop. If, however, ET has already reached zero then before exiting the interrupt routine, the LED will be flashed at step 96.

When the power fail detector 63 signals the microprocessor 28 that a power failure has occurred, control immediately passes from step 80 in the main loop to step 98 as shown in FIG. 3A. At step 98, the microprocessor 28 stores the current value of ET in the non-volatile memory 64 thereby preserving the measure of elapsed time. The power fail detector 63 is designated to allow a sufficient amount of time for the microprocessor 28 to store ET before complete power loss occurs. When power is eventually restored to the microprocessor 28, ET is restored (step 74) to the value saved in the memory 64, i.e., the value that existed just prior to power failure. Accordingly, the elapsed time measured prior to power failure is not lost, and tamper detection simply resumes from that point. Storing ET also preserves any tamper indication because tamper is indicated by the value of ET, i.e., ET<=0. If ET is less than or equal to zero just prior to a power failure, that value will be stored in the memory 64. Consequently, after power to the microprocessor 28 is restored, ET will reassume its previous sub-zero value, and therefore, the LED will again begin to flash as step 96 is executed each time through the interrupt routine of FIG. 3B. Most non-volatile memories, such as memory 64, have a limited write-cycle lifetime, and therefore, storing ET only when a power failure is detected is preferable to storing ET at periodic intervals. However, periodic storage of ET may be employed if a suitable memory technology is available.

Second Embodiment

Figure 4:
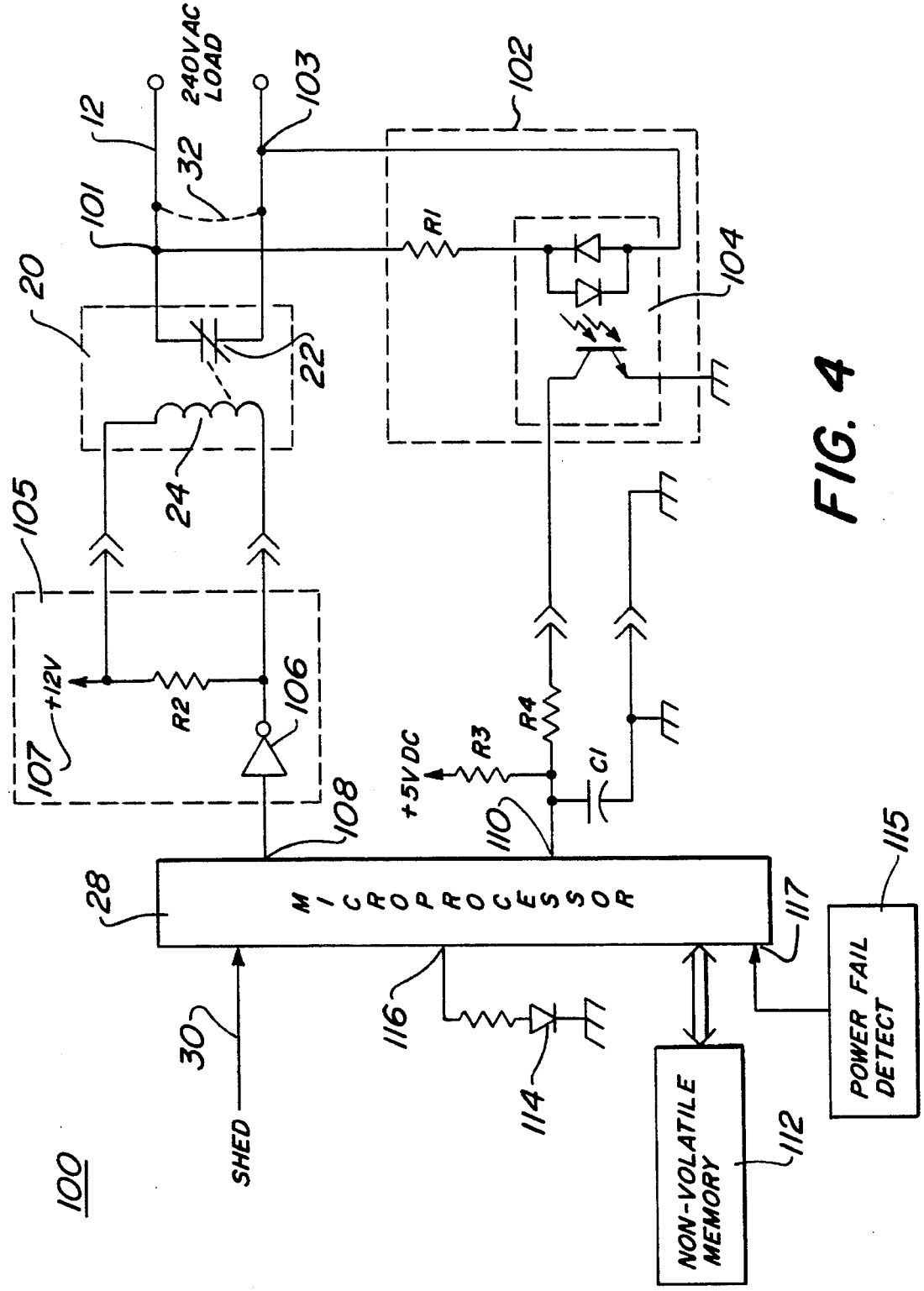
FIG. 4 shows an apparatus for detecting tampering with a load management terminal in accordance with a second embodiment of the present invention.

FIG. 4 shows an apparatus 100 for detecting tampering with a load management terminal in accordance with a second embodiment of the present invention. Preferably, the apparatus 100 shown in FIG. 4 is positioned within the housing of the LMT to prevent unauthorized access. For purposes of illustration, FIG. 4 shows a load control relay 20 (e.g. relay 20 of FIG. 1) coupled to a power line 12. Preferably, the apparatus 100 shown in FIG. 4 is positioned within the housing of the LMT to prevent unauthorized access. According to the second embodiment, tamper (i.e., a by-pass link 32 connected in parallel with the load control relay 20) is detected by sensing whether voltage is present across the relay 20 when the relay 20 is open. If a by-pass link is connected, no voltage will appear across the open relay 20. Applicants recognize, however, that an absence of voltage may be the result of an open thermostat, and not the result of a by-pass link; voltage will not appear across the open contacts 22 if the load's thermostat is open (i.e., the load is not demanding power). Accordingly, tamper is only indicated if, after opening the load control relay 20, voltage does not appear across the open contacts 22 of the relay 20 within a pre-determined time limit. To give the customer the benefit of any doubt, the pre-determined time limit may be relatively long, such as thirty days. If no voltage is sensed during that period, then tampering is probable.

As shown, the apparatus 100 comprises a voltage sensor 102 coupled to the load control relay 20 of a load management terminal for sensing voltage across the load control relay contacts 22 when the relay contacts 22 are open. As described in the Background, the contacts 22 of the relay 20 are normally closed. Relay control circuitry 105, described hereinafter, is provided for energizing the relay 20 to open the contacts 22.

As shown, the voltage sensor 102 is coupled across the relay contacts 22 at points 101 and 103. In the present embodiment, the voltage sensor 102 comprises a resistor R1 and an AC input opto-isolator 104. A voltage appearing across the open contacts 22 of the relay 20 will generate a current through the sensor 102. Resistor R1 limits the current through the opto-isolator 104 to prevent damage. Sensor 102 is coupled to an input 110 of a microprocessor 28, as shown. The microprocessor 28 of FIG. 4 may be identical to the microprocessor 28 of FIG. 2. A 5 V pull-up voltage is applied to the input 110 through resistor R3. When voltage is present across the open contacts 22 of the relay 20, the output of the opto-isolator 104 operates to "pull down" the 5 V pull-up voltage, thereby signaling the microprocessor 28 that voltage is present. There are many ways to implement a voltage sensor, and the present invention is not limited to any one implementation.

The tamper detection apparatus 100 further comprises a timer for measuring elapsed time during which no voltage is sensed across the open contacts 22 of the relay 20, and an indicator for indicating tampering when the elapsed time measured by the timer exceeds a pre-determined time limit. In the present embodiment, microprocessor 28 is employed to implement the timer. However, a discrete component may be employed. For example, a 555 IC timer (not shown) can be used in connection with a counter (not shown). Microprocessor 28, in combination with an LED 114, is also employed in the present embodiment to implement the tamper indicator. Preferably, tamper is indicated by continuously flashing the LED 114 at ¼ second intervals. Implementing the timer and tamper indicator in the microprocessor 28 is extremely cost efficient.

As mentioned above, most load management terminals draw power directly from the power line, and therefore, are susceptible to power outages. Moreover, a devious customer may attempt to interrupt a tamper detection cycle by momentarily disconnecting the terminal from the power line. According to the present embodiment, a power fail detector 115 is provided for detecting interruptions in the power provided to the microprocessor 28. Any suitable circuitry for detecting power failure may be employed, and further details of detector 115 are neither necessary nor limiting. When a power failure is detected, the power fail detector 115 provides a signal to an input 117 of the microprocessor 28. A non-volatile memory 112 is coupled to the microprocessor 28 for storing the elapsed time measured by the timer and for storing any tamper indication in the event of a power failure. Consequently, customers cannot defeat tamper detection by momentarily disconnecting power to the LMT. Preferably, the memory 112 comprises an electrically erasable programmable read only memory (EEPROM), however, any suitable non-volatile memory technology may be employed.

As mentioned above, relay control circuitry 105 provides a means for opening and closing the load control relay 20. According to the present embodiment, the circuitry 105 comprises a 12 V supply 107, resistor R2, and an inverting buffer/amplifier 106. As shown, the buffer 106 is coupled to an output 108 of the microprocessor 28. When the output 108 of the microprocessor 28 is at logic-low, the buffer 106 provides a 12 V output, and therefore, the voltage across the relay coil 24 is approximately zero. When the output 108 goes high, the output of the buffer 106 goes low, sinking current through the relay coil 24 and causing the contacts 22 to open.

Figure 4A:
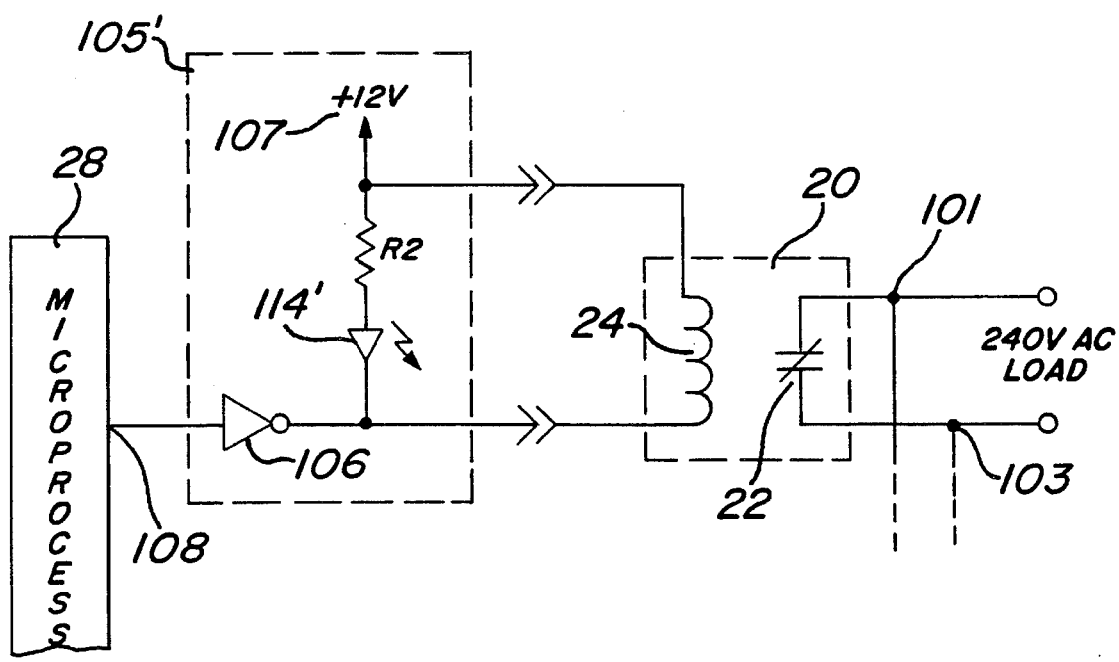
FIG. 4A shows an alternate implementation of the relay control circuitry of FIG. 4.

As described above, the microprocessor 28 flashes the LED 114 when a tamper has occurred. LED 114 may also be used during a normal load shed to indicate that the shed is occurring, i.e., that the load control relay 20 is open. For example, a steady emission (as opposed to flashing) can be used to indicate a shed. As shown in FIG. 4, LED 114 is coupled to a dedicated output port 116 on the microprocessor 28. Unfortunately, in some load management terminals, the number of microprocessor outputs may be limited, and therefore, output port use must be conserved. FIG. 4A illustrates an alternate means for implementing the tamper indicator and shed indicator that conserves at least one output port.

As shown in FIG. 4A, a modified relay control circuit 105' is provided that has an LED 114' coupled between resistor R2 and buffer/amplifier 106. As explained above, output port 108 goes high during a shed in order to energize the relay 20. When the load control relay 20 is energized, current will flow in the LED 114' causing the LED 114' to light. Load shedding, therefore, is automatically indicated with a steady LED output when the relay 20 is energized.

Figure 4B:
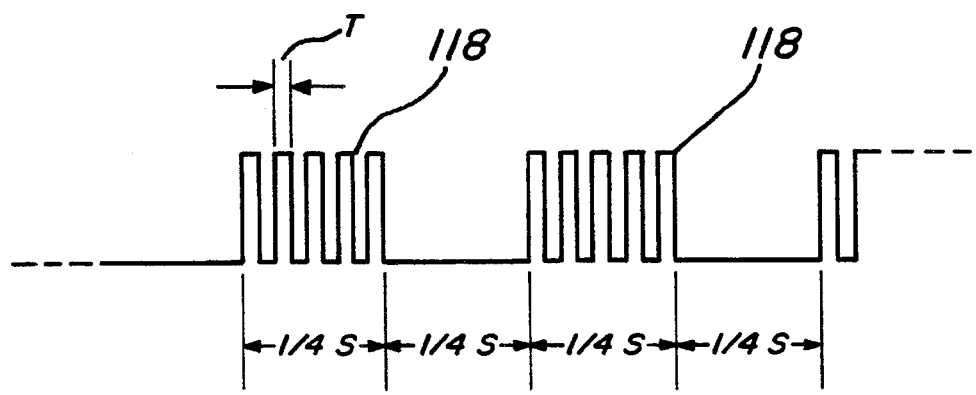
FIG. 4B illustrates a tamper indication signal that is provided to the relay control circuitry of FIG. 4A.

To indicate tampering, the EED 114' is preferably flashed. Flashing could be achieved by simply providing an alternating high-low output signal at output 108. As can be appreciated, however, an alternating high-low signal will cause the relay to constantly open and close. To avoid this, the logic-high portions of the alternating signal at output 108 are comprised of a series of short pulses 118 as shown in FIG. 4B. Each series of pulses 118 produces a seemingly constant illumination of the LED, but each individual pulse has a duration, T, that is shorter than the mechanical pull-in time of the relay 20. Consequently, the LED will flash, but the relay contacts 22 will not open. With most load control relays, a pulse duration of 200 Fs (i.e., T=200 µs) and a pulse-to-pulse spacing of 500 µs is adequate. According to the present embodiment, each series of pulses 118 has a duration of ¼s. Consecutive series of pulses 118 are spaced ¼s apart. Accordingly, the LED flashes at ¼s intervals.

Figure 5A:
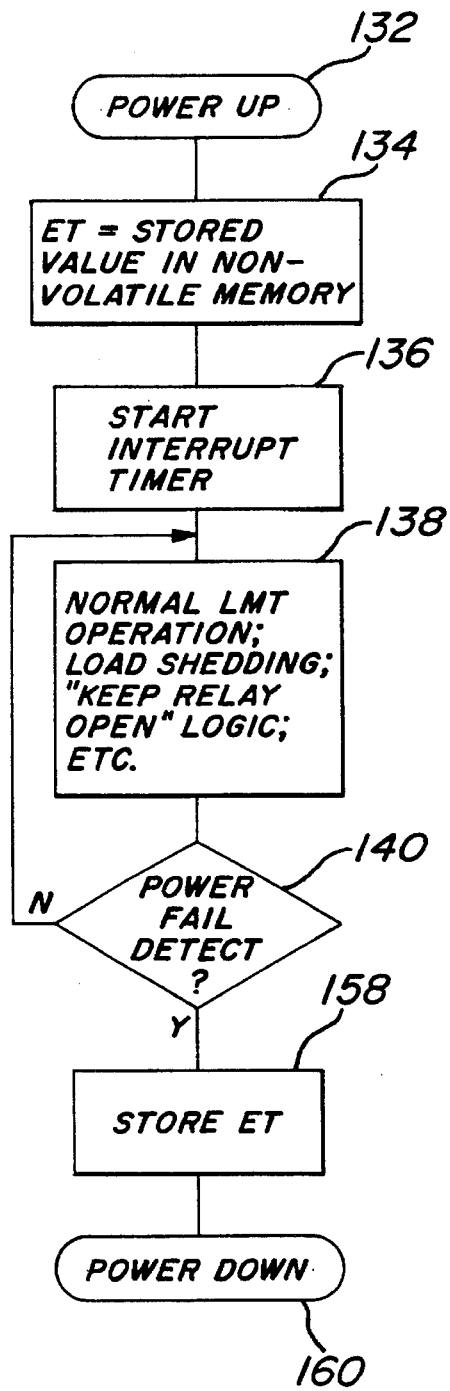
FIGS. 5A and 5B comprise a flowchart illustrating further details of the operation of the apparatus of FIG. 4.
Figure 5B:
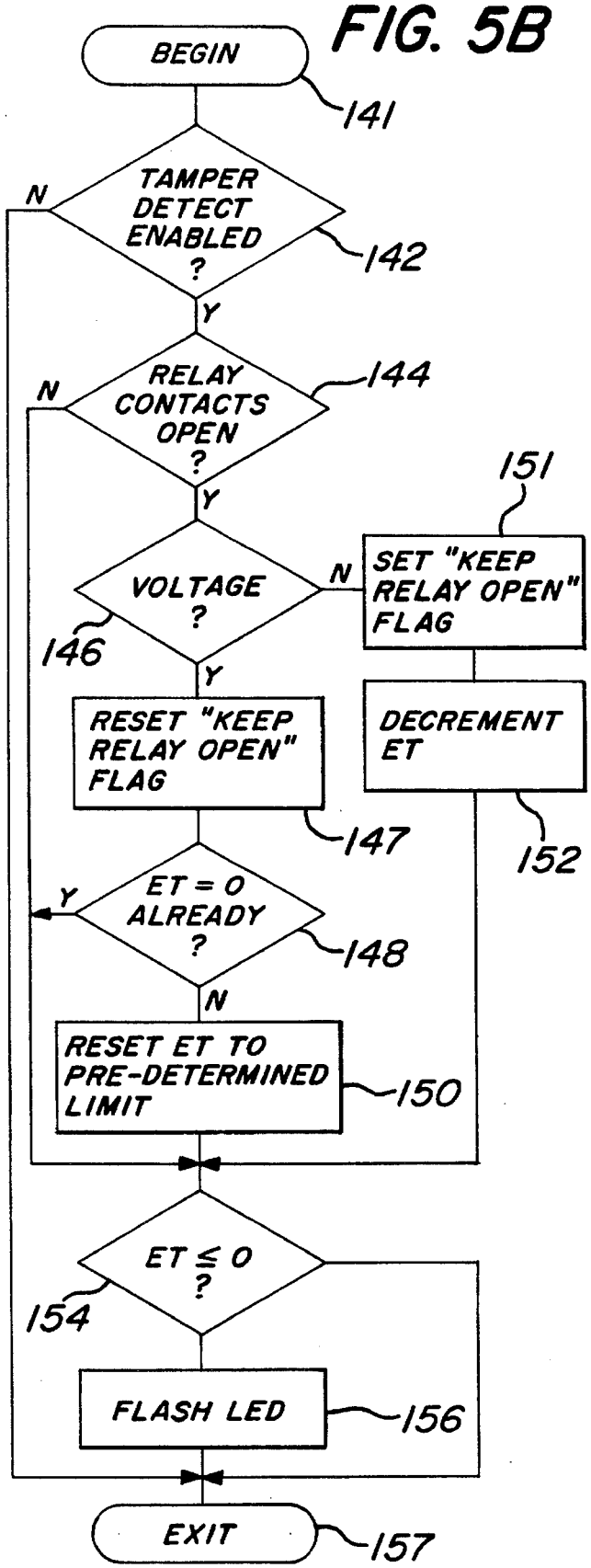

FIGS. 5A and 5B comprise a flow chart illustrating details of the operation of the apparatus 100 of FIG. 4, and the operation of the microprocessor 28 in particular. FIG. 5A illustrates a "main" processing loop of the microprocessor 28, and FIG. 5B illustrates an interrupt routine that is performed in response to a software interrupt generated by the microprocessor 28. Prior to installation of the apparatus 100 at a customer location, the pre-determined time limit, which determines when tamper should be indicated, is stored in a location of the non-volatile memory 112. Referring to FIG. 5A, upon power-up of the apparatus 100 (step 132), control passes immediately to step 134 where an elapsed time variable (ET) is set equal to the pre-determined time limit stored in the non-volatile memory. According to the present embodiment, the measure of elapsed time is maintained by decrementing ET. When ET reaches zero (ET<=0), the pre-determined time limit has expired and tamper will be indicated. Loading ET with the pre-determined time limit and decrementing ET until it reaches zero is the equivalent of loading ET with zero and incrementing ET until it reaches the pre-determined time limit. However, decrementing ET and testing for zero is easier to implement in the microprocessor 28.

At step 136, a software interrupt timer (not shown) is initialized and activated. According to the present embodiment, the software interrupt timer generates a software interrupt every ½ second. Control then passes to a "main" loop comprising steps 138 and 140. During step 138, normal LMT operations are performed. For example, any communications between the LMT and the utility may be performed. Additionally, a load shed command may be received from the utility during this step, in which case the microprocessor 28 will open the relay contacts (e.g., by providing a signal at output 108 in FIG. 4). At step 140, the power fail detector 115 determines whether power to the apparatus 100 has been interrupted. If not, control passes back to step 138. As long as power to the apparatus 100 is not interrupted, the microprocessor 28 continuously loops through steps 138 and 140.

Each time the microprocessor 28 receives a software interrupt from the interrupt timer (not shown), which in the present embodiment is every ½ second, the microprocessor "jumps" to the interrupt routine illustrated in FIG. 5B. Steps 142 through 157 of the interrupt routine are therefore executed once every ½ second. All tamper detection operations are performed in this interrupt routine. As can be appreciated, with the software interrupt facility of the microprocessor 28, tamper detection can effectively occur in tandem with the normal functioning of the LMT.

As shown in FIG. 5B, upon entering the interrupt routine (step 141), control passes immediately to step 142. At step 142, a tamper detect enable flag stored in the non-volatile memory 112 is examined. If the flag is set, then tamper detection is enabled and the apparatus 100 will perform tamper detection. If the flag is not set, then no tamper detection is performed and the microprocessor 28 simply exits the interrupt routine at step 157, passing control back to the "main" loop (steps 138–140). With the tamper detect flag, utilities can enable or disable tamper detection at any customer site.

If tamper detection is enabled, i.e., the tamper detect flag is set, then control passes from step 142 to step 144. At step 144, the microprocessor 28 determines whether the relay contacts 22 are open or closed. As explained above, contacts 22 are normally closed so that the load can receive power from the line as desired. Relay 20 may be opened, however, when a utility signals the LMT to "shed" the load. According to the present invention, tamper detection steps 146 to 152 are only performed when the relay contacts have been opened as a result of a normal load shed operation (e.g. step 138 of FIG. 5A). As explained hereinafter, however, if voltage is not detected across the open contacts, the relay is held open until voltage does appear.

When the relay contacts 22 are closed, no voltage appears regardless of whether a by-pass link has been connected across the contacts. Accordingly, if the microprocessor 28 determines at step 144 that the relay contacts are closed, then voltage detection is not performed and control passes directly to step 154. Unless tamper has already been indicated, i.e., ET has already reached zero, the microprocessor 28 will simply exit the interrupt routine at step 157 and control will pass back to the main loop. If ET has previously reached zero, then before exiting the interrupt routine, the LED will be flashed at step 156.

If the microprocessor 28 determines at step 144 that the contacts are open, control passes to step 146 where the microprocessor 28 examines the signal at input 110 to determine whether voltage is being sensed. If no voltage is sensed, then a "keep relay open" flag is set at step 151, and ET is decremented at step 152. Control then passes to step 154. At step 154, the microprocessor 28 determines whether ET is less than or equal to zero. If ET is less than or equal to zero, then the tamper LED is flashed at step 156 and the microprocessor 28 exits the interrupt routine at step 157, passing control back to the main loop. If the "keep relay open" flag has been set, the microprocessor 28 will not close the relay upon re-entering the main loop, even though the load shed interval may have ended.

If voltage is sensed at step 1416, then control passes to step 147 where the "keep relay open" flag is reset. Control then passes to step 148 where microprocessor 28 determines if tamper has been indicated, i.e., whether ET has already reached zero. If not, then ET is reset to the pre-determined time limit. Having been reset, ET will not equal zero at step 154, and the microprocessor 28 exits the interrupt routine at step 157. If, however, it is determined at step 148 that ET has already reached zero, then despite the fact that voltage was sensed, ET will not be reset at step 150. Rather, control will pass through step 154 to step 156 where the LED will be flashed to indicate tampering. By resetting the "keep relay open" flag in step 147, the microprocessor 28 is able to close the relay at any time. Of course, if the current load shed interval is not complete, the microprocessor 28 may still keep the relay open. The "keep relay open" flag merely serves to override the otherwise normal operation of the relay.

As the foregoing illustrates, once ET reaches zero, step 156 will be performed each time the microprocessor 28 enters the interrupt routine, which in the present embodiment is every ½ second. Consequently, the LED will continuously flash every ½ second thereby indicating a possible tamper condition. A tamper indication can only be removed by resetting ET to the pre-determined limit. According to the present invention, this may be performed by an authorized field technician or by transmitting an appropriate command to the microprocessor 28. As the foregoing illustrates, the microprocessor 28, through the variable ET, implements a timer for measuring the elapsed time during which no voltage is sensed across the open contacts 22 of the load control relay 20. Tamper is indicated when the measure of elapsed time exceeds the predetermined limit (i.e., ET<=0). Because the absence of voltage may be the result of an open thermostat (i.e., the load is not demanding power), ET is preferably initialized with a value equal to about thirty days.

Referring again to FIG. 5A, if the power fail detector 115 signals the microprocessor 28 that a power failure has occurred, control immediately passes from step 140 to step 158. At step 158, the microprocessor 28 stores the current value of ET in the non-volatile memory 112 thereby preserving the measure of elapsed time. The power fail detector 115 is designed to allow a sufficient amount of time for the microprocessor 28 to store ET before complete power loss occurs. When power is eventually restored to the microprocessor 28, ET is restored (step 134) to the value saved in the memory 112, i.e., the value that existed just prior to power failure. Accordingly, the elapsed time measured prior to power failure is not lost, and tamper detection simply resumes from that point. Storing ET necessarily preserves any tamper indication because tamper is indicated through the value of ET, i.e., ET<=0. If ET is less than or equal to zero just prior to a power failure, that value will be stored in the memory 112. After power to the microprocessor 28 is restored, ET will re-assume its previous sub-zero value. Step 156 will therefore continue to be executed each time the interrupt routine of FIG. 3B is executed. Most non-volatile memories, such as memory 64, have a limited write-cycle lifetime, and therefore; storing ET only when a power failure is detected is preferable to storing ET at periodic intervals. However, periodic storage of ET may be employed if a suitable memory technology is available.

As explained above, in the embodiment illustrated in FIGS. 5A and 5B, once the load control relay 20 has been opened, e.g., during a normal load shed, the relay 20 will be kept open until the microprocessor 28 detects a voltage across the open contacts 22 (i.e., until the customer's load demands power). Because the relay is kept open, the tamper detection apparatus is able to continuously monitor for voltage across the open contacts 22 while maintaining a true measure of the elapsed time during which no voltage is detected. As soon as a voltage is detected, the microprocessor 28 will close the relay and reset ET, thereby allowing the customer's load to function normally. The customer is never aware that the relay was open. Of course, if the measure of elapsed time exceeds the pre-determined limit (e.g., about 30 days) before any voltage is detected (i.e., before the load demands power), then tamper is probable.

According to an alternate second embodiment, the relay contacts 22 are not "kept" open until a voltage is sensed. Rather, the relay contacts are only held open for the duration of each normal load shed interval. Load shed intervals may occur once or twice per day, and typically may last for about an hour. Because the relay is only open for the duration of each successive load shed interval, the "elapsed time" measured by the microprocessor 28 will only include the time that elapses during each of those intervals. Because a "true" measure of elapsed time cannot be obtained, the test for tamper must be adjusted for this embodiment. For example, in addition to considering the measured elapsed time, the test may also consider the number of consecutive load shed intervals over which no voltage was detected. Tamper would only be indicated if voltage does not appear after some minimum number of load shed intervals and the measured elapsed time exceeds some pre-determined limit. Of course, the "pre-determined limit" for this alternate embodiment will likely be different than the pre-determined limit for the embodiment wherein the relay is "kept" open until the load demands power.

Third Embodiment

Figure 6:
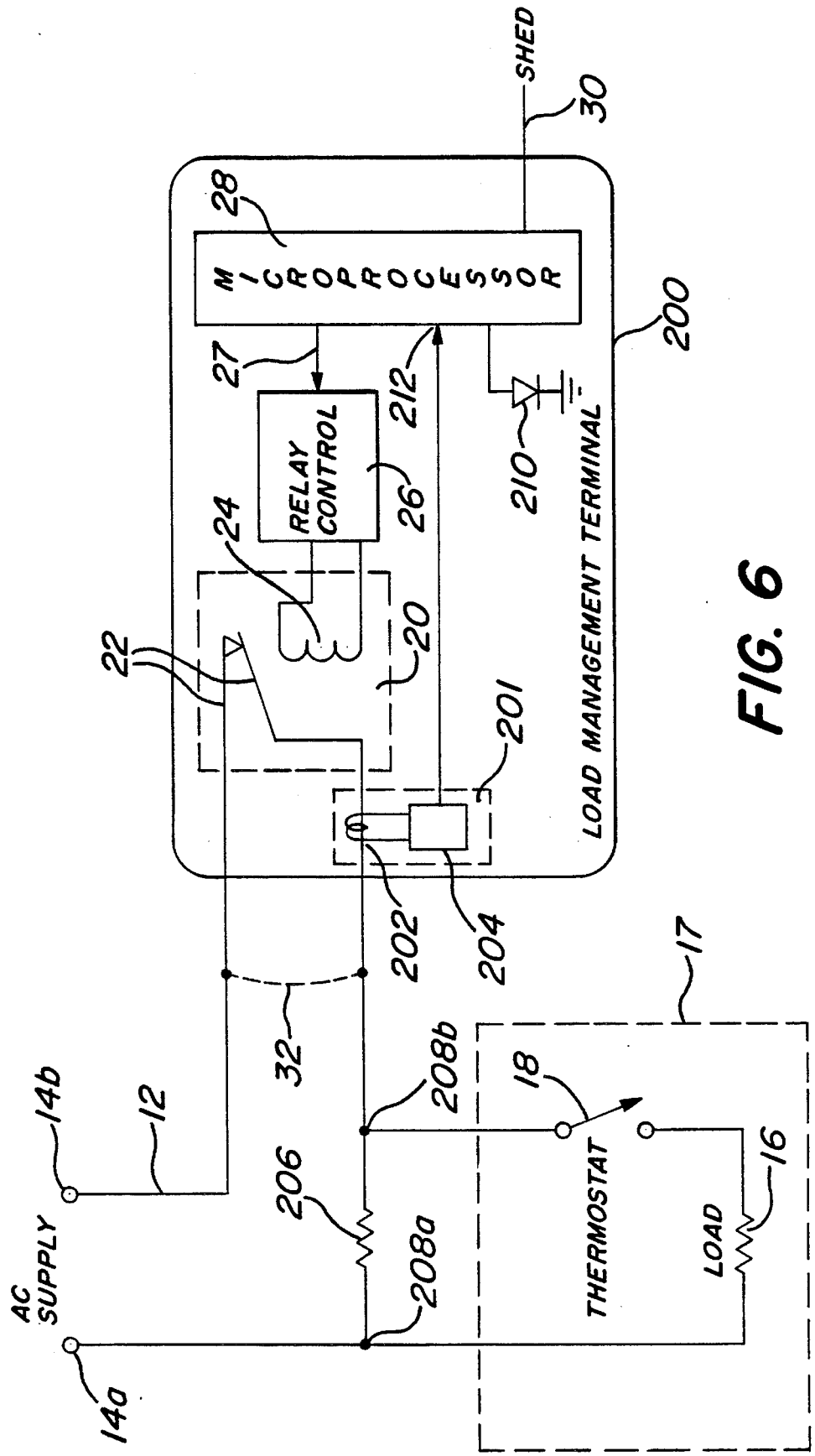
FIG. 6 shows an apparatus for detecting tampering with a load management terminal in accordance with a third embodiment of the present invention.

FIG. 6 shows an apparatus for detecting tampering with a load management terminal 200 in accordance with a third embodiment of the present invention. As shown, the terminal 200 has a load control relay 20 coupled to a power line 12 so as to be in series with a load 16. The load 16 has a thermostat 18. The load 16 and thermostat 18 form a series combination. A microprocessor 28 is provided for controlling the overall operation of the LMT 200. Relay control circuitry 26 is provided for opening and closing the relay 20 in response to a signal output from the microprocessor on line 27. As explained previously, during normal operation of the LMT, the relay contacts 22 are closed so that power is provided (via terminals 14a, 14b) to the load 16 as desired. During periods of peak demand, however, the LMT may receive a load shed command (via line 30) from the utility company, in which case the microprocessor 28 provides a signal on line 27 causing the control circuitry 26 to open the contacts 22 of the relay 20. As explained above, unscrupulous customers can avoid a "shed" by connecting a by-pass link 32 to the power line 12 in parallel with the relay 20, as shown.

According to the third embodiment, apparatus for detecting such tampering comprises a resistance 206 connected to the power line 12 in parallel with at least the load thermostat 18. When the load 16 and thermostat 18 are both positioned within a housing 17, the resistance may be connected across the series combination of the load 16 and thermostat 18, i.e., at points 208a and 208b. Otherwise, the resistance 208 can be connected directly across the thermostat 18. The resistance 206 operates to ensure that at least a nominal current flows through the load control relay whether the thermostat contacts are open or closed; load current flows when the thermostat 18 is closed, and the nominal current flows when the thermostat 18 is open. As a result, a continuous current flow through the normally closed relay contacts 22 is maintained.

The tamper detection apparatus further comprises a current sensor 201 for sensing current flow through the load control relay 20 and for detecting interruptions in the continuous current flow. An indicator is provided for indicating tampering when an interruption in the continuous current flow through the relay is detected. According to the present embodiment, the current sensor 201 comprises a current transformer 202 coupled to the power line 12 proximate the load control relay 20 and a comparator 204. The transformer 202 produces an output voltage proportional to the current flowing through the power line. The comparator 204 compares the output voltage from the transformer 202 to a pre-determined threshold. When the output voltage falls below the threshold, an interruption in the current flowing though the relay 20 is assumed. The threshold is set such that the comparator 204 will trigger only if the current in the relay 20 is less than the nominal current provided by the resistance 206.

As shown, the output of the comparator 201 is provided to an input 212 of the microprocessor 28. Microprocessor 28, together with an LED 210, is employed to implement the indicator. Microprocessor 28 continuously polls input 212 to determine whether current has been interrupted. When an interruption is detected, the microprocessor 28 provides a tamper indication by blinking the LED 210. In addition, if the LMT 200 is capable of communicating with the utility company, the microprocessor 28 will transmit a tamper indication signal to the utility.

Figure 7:
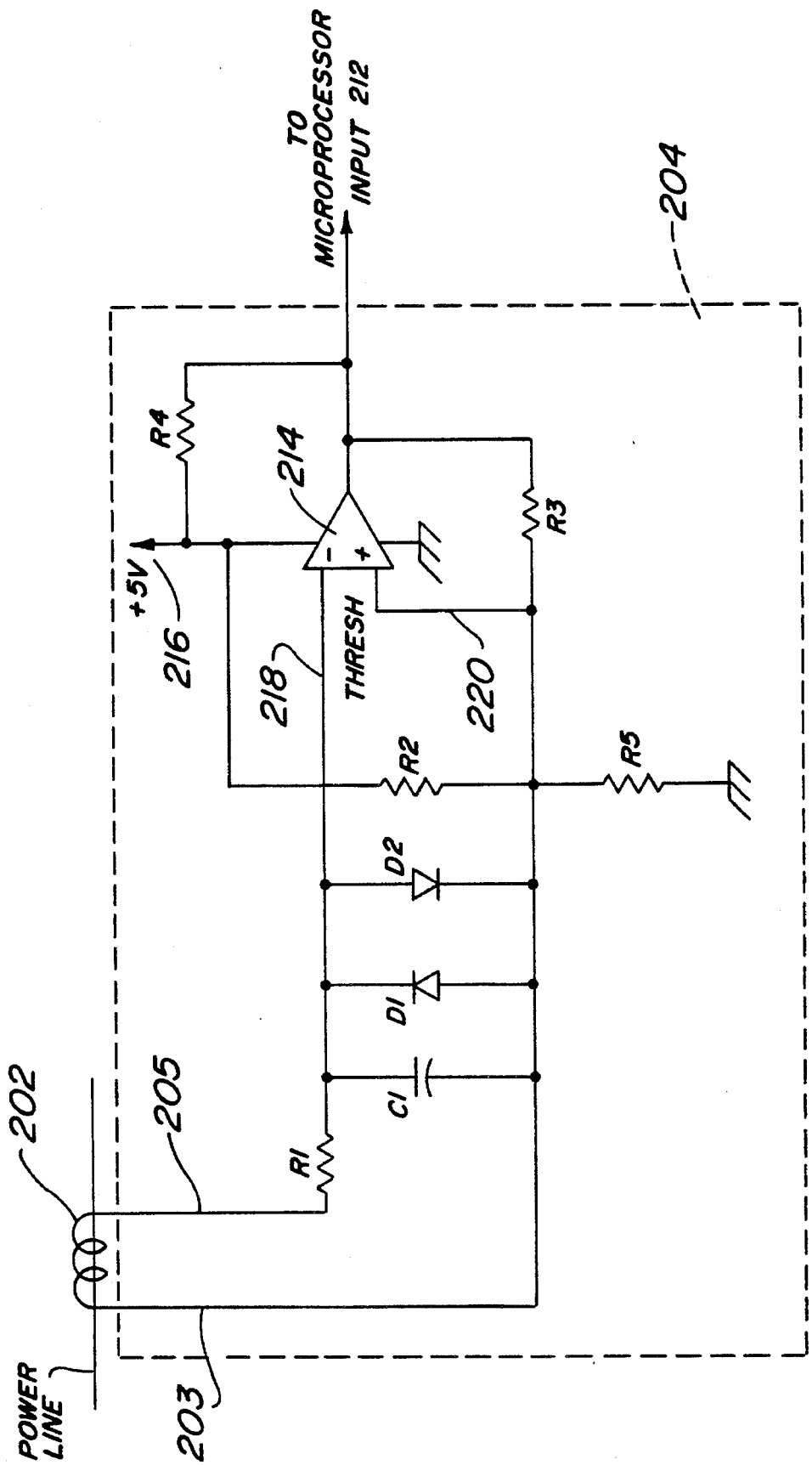
FIG. 7 is a detailed circuit diagram of the current sensor of FIG. 6.

FIG. 7 is a block diagram illustrating details of one embodiment of the comparator 204 of FIG. 6. There are many ways to implement a comparator, and the comparator 204 is not limited to the embodiment shown. Rather, any suitable comparator may be employed without deviating from the spirit and scope of the present invention.

In the embodiment illustrated in FIG. 7, the comparator 204 comprises an operational amplifier 214 and associated components R1, R2, R3, R4, R5, C1, D1 and D2. As shown, the current transformer is coupled across the inputs of the amplifier 214. A reference or threshold voltage is applied to the non-inverting input 220 of amplifier 214. Capacitor C1 and resistor R1 provide low pass filtering. Protective limiters D 1 and D2 are provided to prevent damage to the amplifier 214 from excessive voltages. The output of the amplifier 214 is open collector to interface with the input 212 of the microprocessor 28.

Figure 8:
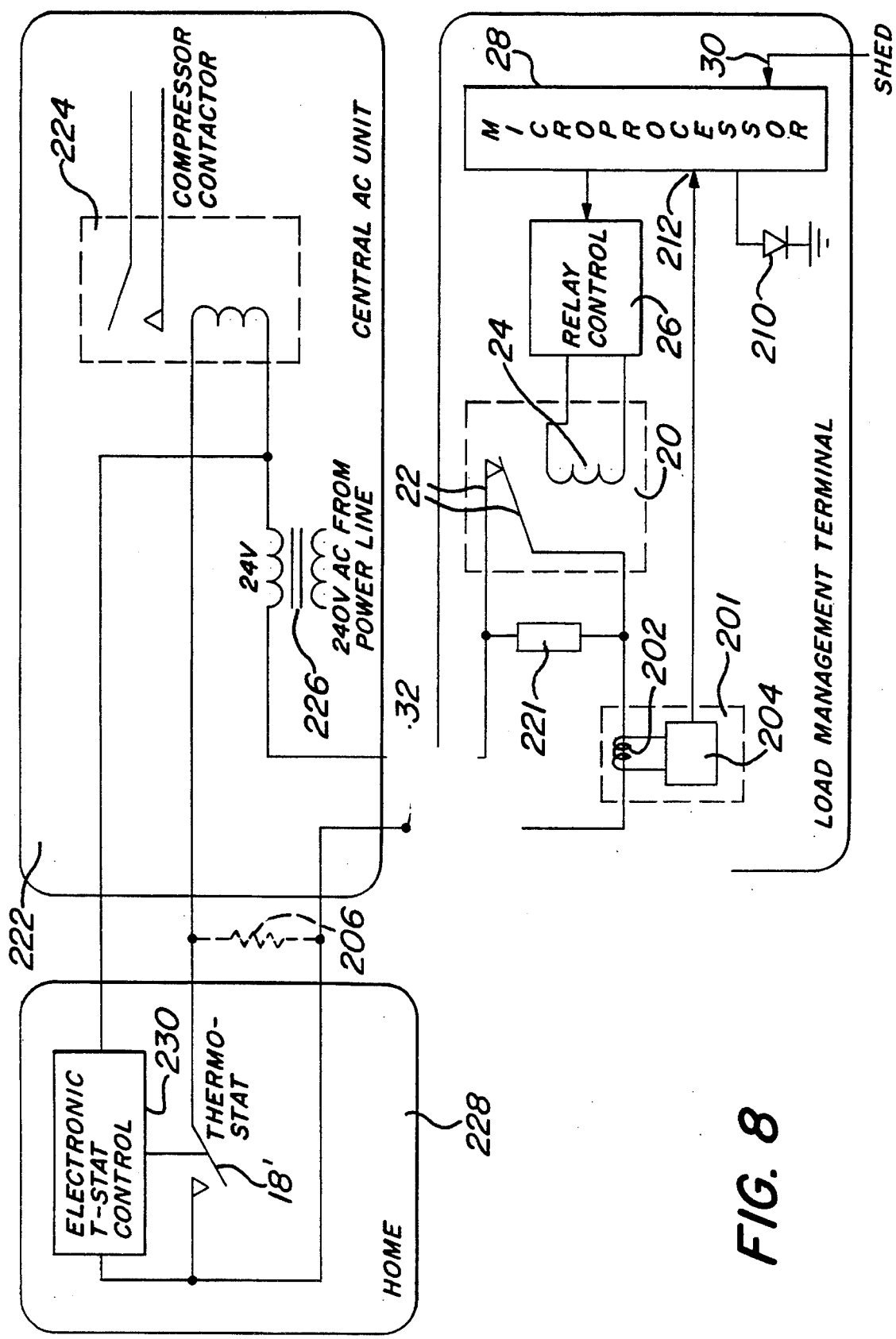
FIG. 8 illustrates an application of the third embodiment of the tamper detection apparatus to a load management terminal that is connected to a residential air-condition unit having an electronic thermostat.

FIG. 8 illustrates the connection of a load management terminal 200' to a residential air conditioning unit 222 that has an electronic thermostat 18' for remotely controlling the unit 222 from the customer's home 228. As shown, the central air-conditioning unit 222 comprises a normally open compressor relay 224 for activating the air conditioner's compressor (not shown). Power is provided to the unit 222 with a 240 V–24 V transformer 226. Electronic thermostat control circuitry 230 is coupled across the transformer 230 to maintain power to the circuitry 230.

Electronic thermostats typically have to be reset when power to the control circuitry 230 is interrupted. Load management terminals can severely inconvenience customers that have electronic thermostats because when the load control relay 20 is opened during a load shed, power to the thermostat control circuitry 230 is interrupted. To avoid this problem, when a load management terminal is connected to a load that has an electronic thermostat, a constant current sink circuit is coupled across the load control relay to ensure that the thermostat electronics still receive a small amount of power during a load shed. Such a circuit is provided in load management terminal 200' at block 221. When the relay contacts 22 are opened during a shed, a small current will still flow through the constant current sink 221 thereby maintaining power to the electronic thermostat control circuitry 230. Of course, the small amount of power provided to the control electronics 230 is insufficient to affect the load.

When a load management terminal, such as terminal 200', is connected to a load that has an electronic thermostat (e.g. thermostat 18'), there is no need to connect the resistance 206 across the thermostat 18' because the constant current sink 221 ensures continuous current flow. Stated otherwise, the resistance 206 in this case may be infinite. In such a case, the current sensor 201 is positioned in the circuit after the constant current sink 221, as shown. If, however, a mechanical thermostat were employed in FIG. 8, and the control circuitry 230 and constant current sink 221 were not present, then the resistance 206 must be connected in parallel with at least the thermostat 18' as shown in FIG. 8 with dashed lines.

From the foregoing description, it can be seen that the present invention comprises methods and apparatus for detecting tampering with a load management terminal. Changes can be made to the embodiments described above without departing from the broad inventive concepts thereof. It is understood, therefore, that this invention is not limited to the particular embodiments disclosed, but is intended to cover all modifications that are within the scope and spirit of the invention as defined by the appended claims.

What is claimed is:

1. Apparatus for detecting tampering with a load management terminal, said terminal being connected to a power line and to a load, said terminal having a load control relay coupled in series to the power line wherein the load is selectably decoupled from the power line by opening the load control relay, said apparatus comprising:

a voltage sensor coupled to the load control relay for sensing whether voltage is present across said load control relay when said load control relay is open;

a timer for measuring elapsed time during which no voltage is sensed across said load control relay when said load control relay is open; and an indicator for indicating tampering when the elapsed time measured by said timer exceeds a pre-determined time limit.

2. Apparatus of claim 1 further comprising a non-volatile memory for storing the elapsed time measured by said timer and for storing the tamper indication provided by said indicator.

3. Apparatus of claim 1 wherein said timer and said indicator comprise a microprocessor coupled to said voltage sensor.

4. Apparatus of claim 3 wherein said indicator further comprises a light emitting diode coupled to said microprocessor.

5. Apparatus of claim 4 wherein the light emitting diode is further coupled the load control relay so as to be illuminated when an energizing voltage is applied across the load control relay, and wherein tampering is indicated by applying a series of consecutive electrical pulses to said load control relay, each pulse having a magnitude equal to the energizing voltage and having a duration shorter than a mechanical pull-in time of the load control relay, whereby the series of pulses illuminates the light emitting diode without opening the load control relay.

6. Apparatus of claim 3 wherein the microprocessor is optically isolated from the voltage sensor.

7. Apparatus of claim 1 further comprising means for holding the load control relay open until a voltage is sensed across the load control relay.

8. Apparatus of claim 1 further comprising means for resetting the timer if a voltage is sensed across the load control relay before the elapsed time measured by the timer exceeds the pre-determined limit.

9. Apparatus of claim 1 wherein the load management terminal has a housing surrounding the load control relay and wherein the tamper detection apparatus is positioned within said housing.

10. In a load management terminal having a load control relay coupled to a power line and to a load wherein the load is selectably decoupled from the power line by opening the load control relay, a method of detecting tampering with said terminal comprising the steps of:

opening said load control relay;

sensing whether voltage is present across said load control relay when said load control relay is open;

maintaining a measure of elapsed time during which no voltage is sensed across said load control relay when said load control relay is open; and generating a tamper indication when the measure of elapsed time exceeds a pre-determined time limit.

11. The method of claim 10 further comprising the step of holding the load control relay open until a voltage is sensed across the load control relay.

12. The method of claim 10 further comprising the step of resetting the measure of elapsed time if a voltage is sensed across the load control relay before the measure of elapsed time exceeds the pre-determined limit.

13. Method of claim 10 further comprising the step of storing the measure of elapsed time in a non-volatile memory.

14. Method of claim 10 further comprising the step of storing said tamper indication in a non-volatile memory.

* * * * *

UNITED STATES PATENT AND TRADEMARK OFFICE
CERTIFICATE OF CORRECTION

PATENT NO. : 5,488,565
DATED : January 30, 1996
INVENTOR(S) : Jerry M. Kennon et al.

It is certified that error appears in the above-indentified patent and that said Letters Patent is hereby corrected as shown below:

Col. 13, line 36, "Fs" should be --$\mu$s--.

Col. 15, line 7, "1416" should be --146--.

Signed and Sealed this

Twenty-first Day of October 1997

Attest:

BRUCE LEHMAN

Attesting Officer

Commissioner of Patents and Trademarks